(12) United States Patent
Flaster et al.

(10) Patent No.: US 10,655,934 B2
(45) Date of Patent: May 19, 2020

(54) TRIPLE WAVELENGTH POINTING DEVICE

(71) Applicant: JM ACQUISITIONS, INC., Cheyenne, WY (US)

(72) Inventors: Jonathan K. Flaster, San Diego, CA (US); Steve Mencanin, Aliso Viejo, CA (US); Timothy M. Langan, Mission Viejo, CA (US); Adam Flaster, Tempe, AZ (US)

(73) Assignee: J.M. Acquisitions Inc., Cheyenne, WY (US)

( * ) Notice: Subject to any disclaimer, the term of this patent is extended or adjusted under 35 U.S.C. 154(b) by 0 days.

(21) Appl. No.: 15/981,815

(22) Filed: May 16, 2018

(65) Prior Publication Data

US 2018/0259295 A1    Sep. 13, 2018

Related U.S. Application Data

(62) Division of application No. 14/757,706, filed on Dec. 23, 2015.

(60) Provisional application No. 62/096,108, filed on Dec. 23, 2014.

(51) Int. Cl.
| | |
|---|---|
| *G02B 27/30* | (2006.01) |
| *F41G 1/35* | (2006.01) |
| *G02B 26/00* | (2006.01) |
| *H01S 5/00* | (2006.01) |
| *H01S 5/40* | (2006.01) |

(52) U.S. Cl.
CPC .............. *F41G 1/35* (2013.01); *G02B 26/007* (2013.01); *G02B 27/30* (2013.01); *H01S 5/005* (2013.01); *H01S 5/4087* (2013.01)

(58) Field of Classification Search
CPC .......... G02B 7/00; G02B 7/003; G02B 7/004; G02B 7/005; G02B 7/02; G02B 7/10; G02B 7/102; G02B 26/00; G02B 26/007; G02B 26/08; G02B 26/0875; G02B 27/00; G02B 27/0081; G02B 27/09; G02B 27/0916; G02B 27/0922; G02B 27/0938; G02B 27/095; G02B 27/0955; F41G 1/35

See application file for complete search history.

(56) References Cited

U.S. PATENT DOCUMENTS

| | | |
|---|---|---|
| 5,426,533 A | 6/1995 | Wallace |
| 5,491,546 A | 2/1996 | Wascher et al. |

(Continued)

*Primary Examiner* — Thong Q Nguyen
(74) *Attorney, Agent, or Firm* — Lynch LLP; Sean Lynch

(57) ABSTRACT

This application discloses systems and methods of a laser device which could be used to aim firearms. The device includes a laser diode capable of emitting two or more different wavelengths of light to form a laser using a collimator, for example a single collimator or a compound collimator. In embodiments using a single collimator, the collimator can be repositioned at different distances from the laser diode to ensure proper positioning to create a laser beam for the particular wavelength of light emitted from the laser diode. In embodiments using a compound collimator, the collimator could have different collimating regions and be configured to rotate to cause the different collimating regions to receive light emitted from the laser diode such that different light wavelengths are properly collimated without needing to alter the distance from the collimator to the laser diode.

4 Claims, 9 Drawing Sheets

(56) References Cited

U.S. PATENT DOCUMENTS

| | | | |
|---|---|---|---|
| 5,576,897 A * | 11/1996 | Kuo | G02B 7/14 |
| | | | 359/441 |
| 5,671,561 A | 9/1997 | Johnson et al. | |
| 6,956,322 B2 | 10/2005 | Ikeda | |
| 7,068,699 B2 | 6/2006 | Nettleton et al. | |
| 7,376,116 B2 | 5/2008 | Rozenblit | |
| 7,486,712 B2 | 2/2009 | Hata | |
| 2002/0064192 A1* | 5/2002 | Missey | G02B 6/4214 |
| | | | 372/20 |
| 2008/0205249 A1 | 8/2008 | Bae | |
| 2009/0223072 A1 | 9/2009 | Morin | |
| 2012/0171643 A1* | 7/2012 | Reardon | F41A 33/02 |
| | | | 434/11 |
| 2013/0235609 A1 | 9/2013 | Nemeyer | |

* cited by examiner

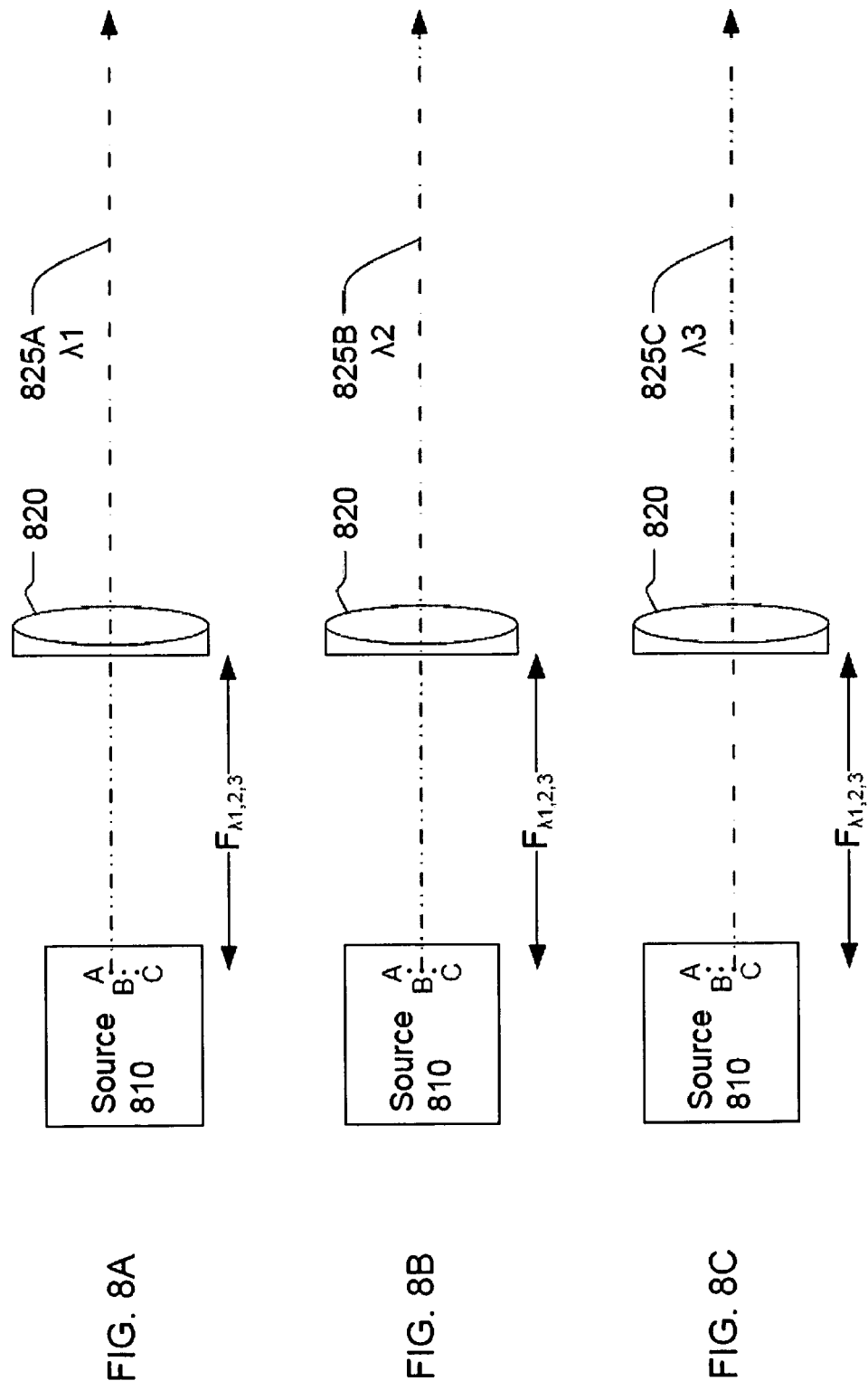

TRIPLE WAVELENGTH POINTING DEVICE

This application is a divisional and claims priority to Utility patent application Ser. No. 14/757,706, filed Dec. 23, 2015 and claims priority from Provisional Patent Application No. 62/096,108, filed Dec. 23, 2014, titled TRIPLE WAVELENGTH POINTING DEVICE. All extrinsic materials identified herein are incorporated by reference in their entirety.

FIELD OF THE INVENTION

The field of the invention is laser devices for firearms.

BACKGROUND

The background description includes information that may be useful in understanding the present invention. It is not an admission that any of the information provided herein is prior art or relevant to the presently claimed invention, or that any publication specifically or implicitly referenced is prior art.

Current technology for laser devices use with firearms fails to appreciate new ways of creating lasers from different wavelengths of electromagnetic radiation, and the advantages that come with such a device.

For example, U.S. Pat. No. 5,671,561 to Johnson et al. discloses a modular, combination laser and electronic aiming system that creates a laser to assist with aiming a firearm. But Johnson et al. fails to contemplate the use of a diode capable of emitting electromagnetic radiation at multiple wavelengths.

Similarly, U.S. Pat. No. 5,491,546 to Wascher et al. discloses a laser sight for weapons that, like Johnson et al., creates a laser at only one wavelength, specifically a wavelength that is easily visible during the day. Wascher et al. fails to contemplate devices that create lasers having different wavelengths.

U.S. Pat. No. 7,068,699 to Nettleton et al., on the other hand, contemplates the use of diodes that can emit multiple different wavelengths of light. But Nettleton et al. requires the implementation of an integrated dichroic substrate having three different substrates positioned such each substrate reflects a different wavelength of light toward a collimator. This configuration accounts for the different focal lengths of different wavelengths of light, but it can be costly to produce the different dichroic substrates and this implementation is also needlessly complicated.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The following description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

Thus, there is still a need for improved laser devices for firearms

SUMMARY OF THE INVENTION

The inventive subject matter provides apparatus, systems and methods of a laser device for firearms.

In a first aspect of the inventive subject matter, the inventors contemplate a laser device for a firearm that includes a laser diode and a compound collimator. In preferred embodiments the laser diode can generate an electromagnetic emission that has one, two, three, or more different wavelengths (e.g., visible light, ultraviolet light, infrared light, xrays, gamma rays, radio waves). The compound collimator is made up of two or more collimators, where each collimator is preferably configured to collimate different wavelength emissions from the laser diode.

In preferred embodiments, the inventors contemplate that the collimators on the compound collimator can be configured such that the focal length for each wavelength of electromagnetic radiation (EMR) emitted by the laser diode is the same. In these embodiments, to change between focusing different wavelengths of EMR emitted from the laser diode, the compound collimator can rotate about a central axis to activate different collimators disposed on the compound collimator. To facilitate rotation, the laser device can additionally include a rotating mechanism that causes the compound collimator to rotate about the axis of rotation (e.g., an electronic motor such as a stepper motor) in response to a trigger.

In embodiments having a compound collimator, each collimator disposed on the compound collimator can be equidistant from the axis of rotation. In other embodiments, each collimator's position on the compound collimator can be located at a different radial location to compensate for slightly different locations of each wavelength's true emission location (because although small, the laser diode in some embodiments can include two, three, or more diodes that each emit EMR from slightly different non-overlapping locations).

In embodiments having a compound collimator, the laser diode can emit different wavelengths of EMR depending on the position that the compound collimator is in. For example, if the compound collimator is in a first angular position, then the laser diode can emit visible light. If the compound collimator is moved to a second angular position, then the laser diode can emit ultraviolet light. In a third angular position, the laser diode can emit infrared light. In some embodiments, the laser device can additionally include a locking mechanism for lock the compound collimator into the different angular positions.

In another aspect of the inventive subject matter, the inventors contemplate a laser device for a firearm that includes a laser diode and a collimator. In preferred embodiments of this aspect, the laser diode generates an emission of at least two wavelengths of EMR. The collimator can collimate the emissions from the laser diode as a function of its position (e.g. distance from the laser diode). By placing the collimator at a distance from the laser diode based on the focal length of the particular laser diode emission, a single collimator can be implemented for the laser device.

Preferred embodiments additionally include a positioning mechanism to facilitate positioning the collimator at the different positions required to focus the different wavelength EMR emissions from the laser diode (e.g., at a first, second, and third position for laser diodes capable of emitting three different wavelength of EMR). The positioning mechanism can include detents that lock, or otherwise hold the collimator in place relative to the laser diode, at the various distances from the laser diode.

In some embodiments, the laser diode can be configured to emit a first wavelength of EMR when the collimator is in a first position and automatically switch to a second wavelength of EMR when the collimator is in a second position. To facilitate switching the collimator from position to position along the positioning mechanism, the laser device can additionally include a motor and control system that moves the collimator in response to a triggering mechanism.

Another aspect of the inventive subject matter includes a method of identifying a target using a laser device. The steps include: (1) activating a laser diode that generates an emission of EMR (e.g., a laser diode that generates one, two, three or more different wavelengths of EMR, such as visible light, ultraviolet light, and infrared light or any combination thereof); (2) positioning a collimator at a distance from the laser diode; (3) using the collimator to collimate the emission; and (4) pointing the collimated emission at the target.

In some embodiments, the method additionally includes the step of positioning the collimator at another distance from the laser diode.

In other embodiments, the collimator remains at a fixed distance from the laser diode and it includes multiple collimating regions (e.g., multiple collimators in the form of a compound collimator as described above). In embodiments that include a compound collimator, the method could comprise the step of rotating the compound collimator from a first angular position to a second angular position instead of, or in addition to, moving the collimator to different distances relative to the laser diode. When the compound collimator is in the first angular position, the first type of emission from the laser diode is received by a first collimating region, and when the compound collimator is in the second angular position, the second type of emission from the laser diode is received by the second collimating region.

In still another aspect of the inventive subject matter, the inventors contemplate a method of manufacturing a laser device for firearms. The method includes the steps of: (1) placing in a housing a laser diode capable of generating multiple different EMR emissions (e.g., visible light, infrared light, and ultraviolet light); and (2) fixing in the housing, at a distance from the laser diode, a rotating compound collimator having different collimators that correspond to the different EMR emissions from the laser diode.

In some embodiments, the method additionally includes the step of affixing a locking mechanism to the rotating compound collimator to hold the rotating compound collimator in at least a first angular position and a second angular position. The method can also include the step of implementing a closed-loop control system to rotate the rotating compound collimator to at least a first angular position and a second angular position. In some embodiments, the method also includes the step of sensing a power level output by the active light emitter to provide feedback to the power supply.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWING

FIGS. 8A, 8B, and 8C are optical schematic diagrams of another laser device configured to compensate for slight differences emission positions of first, second, and third wavelengths, respectively.

DETAILED DESCRIPTION

It should be noted that any language directed to a computer should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1:
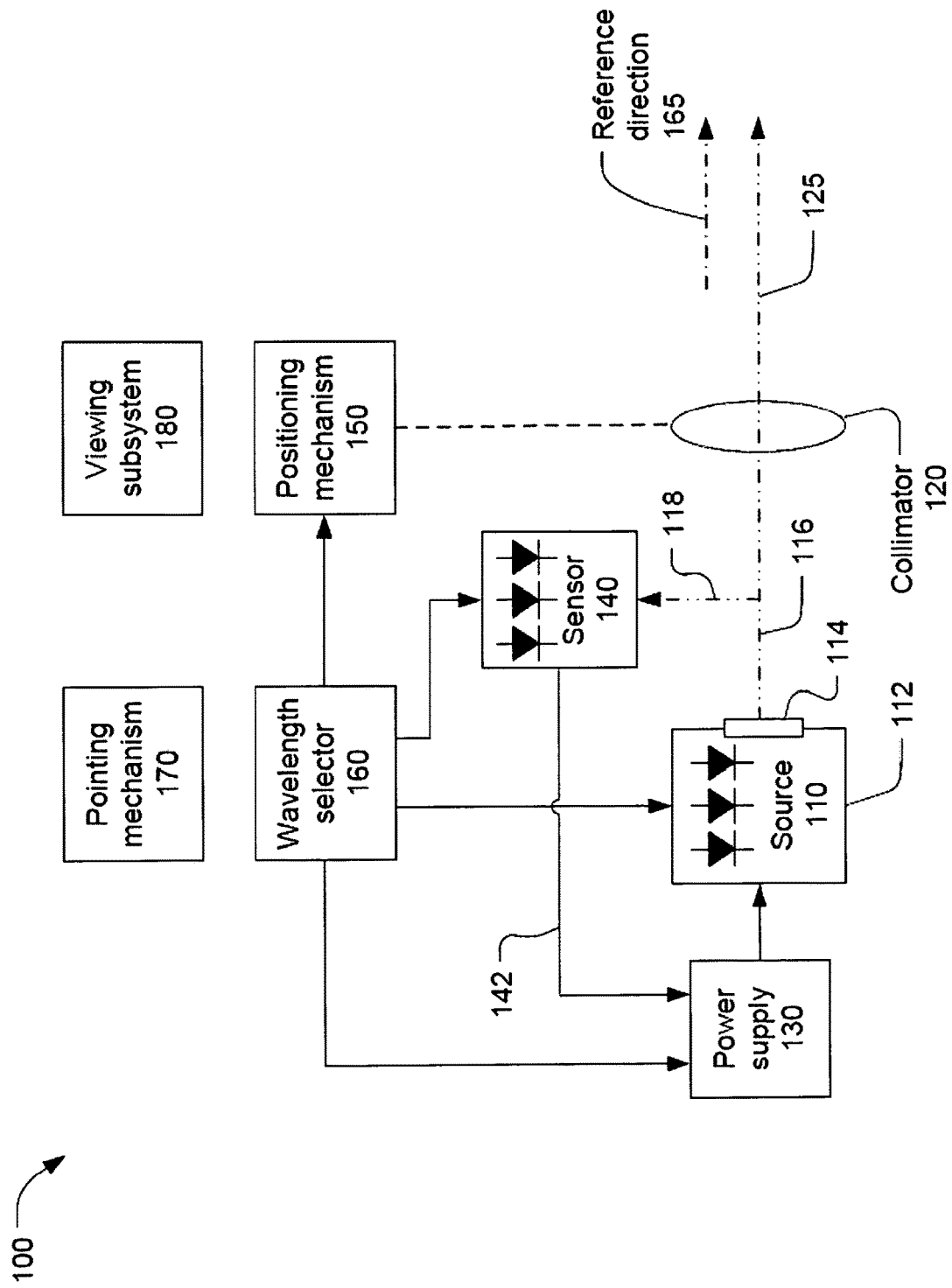
FIG. 1 is a functional block diagram of a laser device for a firearm.

FIG. 1 is a functional block diagram of a laser device 100. The laser device 100 includes a laser diode 110 (in this embodiment, a laser diode capable of emitting three different wavelengths of light), a collimator 120, a power supply 130, a positioning mechanism 150, and a wavelength selector 160. The laser device 100 may also include a sensor 140, a pointing mechanism 170, and a viewing subsystem 180.

The laser diode 110 includes three solid-state light emitters integrated within a single package 112, although more or less light emitters of any type could be used in multiple packages without departing from the scope of the invention. The three solid-state light emitters may be laser diodes, light emitting diodes, or other solid state sources. The three solid-state light emitters may be fabricated on two or three separate semiconductor substrates or chips that may then be integrated within the package 112. For example, two or three semiconductor substrates may be stacked within the package 112 as described in U.S. Pat. Nos. 6,956,322, 7,376,116, or 7,486,712. The package 112 may be, for example, a metal can with a transparent window as illustrated in each of these patents. The package 112 may be a ceramic, metal, or plastic enclosure of some other shape. Package 112 preferably has a transparent widow 114 to allow light emitted from the three solid state light emitters to exit the package. While package 112 has at least two electrical terminals to allow power to be supplied to the light emitters, preferably package 112 has at least four electrical terminals to allow power to be supplied independently to each of the light emitters. Using separate electrical terminals allows the power supply to easily turn on and off the light emitters as a function of the wavelength selector.

One of the three light emitters within the laser diode 110 could be configured to emit optical energy at an invisible infrared wavelength. Another of the three light emitters could be configured to emit light at a visible wavelength, which is typically red or green. The third of the three light emitters could be configured to emit light at an invisible ultraviolet wavelength (i.e. a wavelength less than 380 nm) or a barely-visible violet wavelength (i.e. a wavelength between 380 and 420 nm).

In a preferred embodiment, the light from all three light emitters within the laser diode 110 could be configured to emanate from a common point within the package. In some embodiments, the wide difference in wavelength of the three light emitters could dictate that each light emitter be fabricated on a separate semiconductor chip which may then be mounted within the common package 112.

Figure 2:
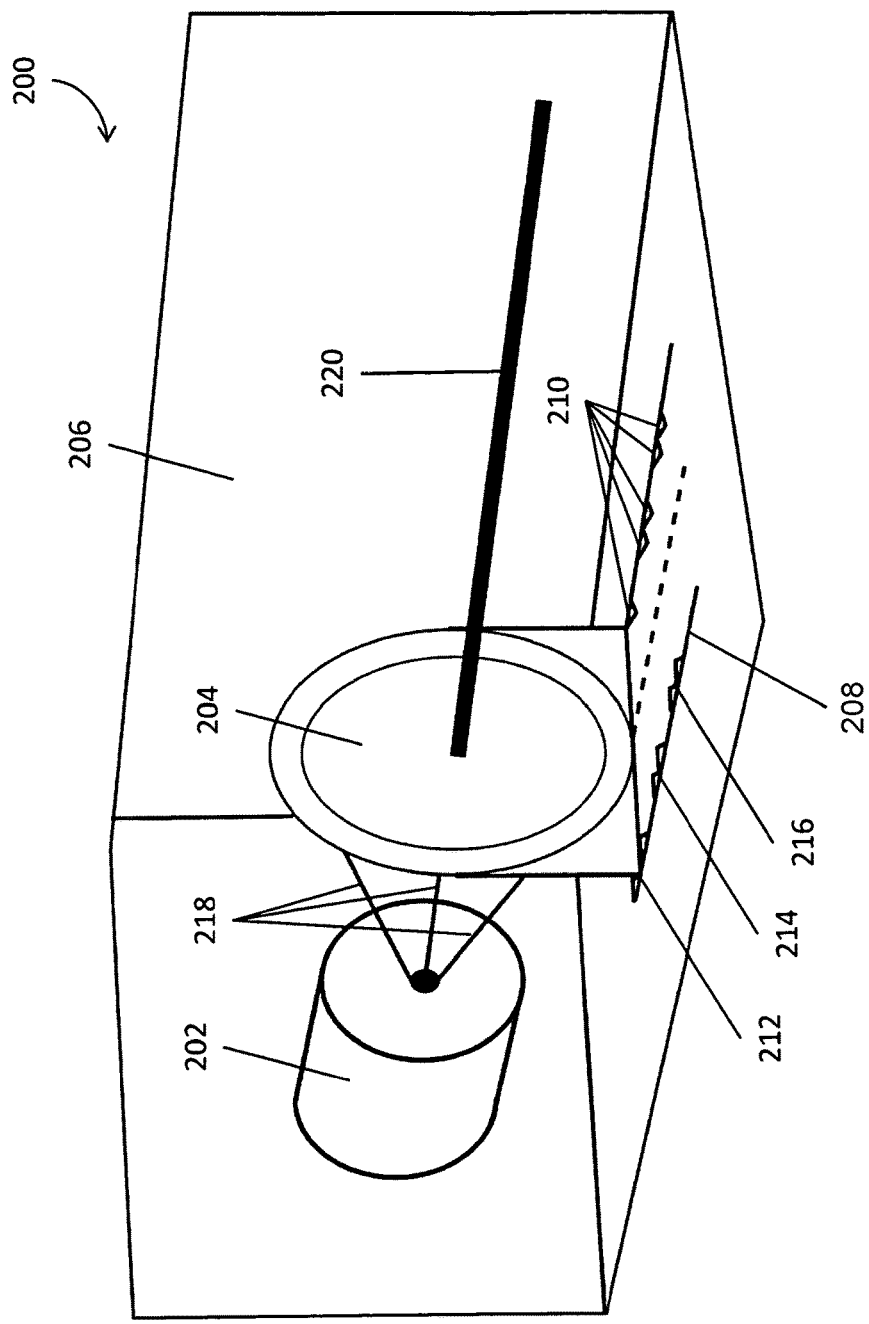
FIG. 2 shows a possible configuration for the laser diode and collimator of an embodiment of a laser device.

FIG. 2 shows an embodiment of a laser device 200 that includes a laser diode 202, a non-achromatic collimator 204 (if an achromatic collimator is used, then different positions would not be required because the focal lengths would be the same), a housing 206 (shown cutaway), a positioning mechanism 208, and detents 210 along the positioning guide 208 to hold the non-achromatic collimator 204 in a first position 212, a second position 214, and a third position 216. As described above with respect to FIG. 1, in some embodiments the laser diode can project two, three, or more different wavelengths of electromagnetic radiation (EMR). Preferably, the laser diode 202 can project ultraviolet light, visible light, and infrared light, but the laser diode can alternatively emit any combination of two or more wavelengths of EMR without departing from the inventive concepts described in this application.

To take into account that different wavelengths of EMR emitted from the laser diode 202 could each have different focal lengths, the positioning mechanism 208 has detents 210 that hold the collimator in three different positions 212, 214, and 216. Each position 212, 214, and 216 is configured to enable the non-achromatic collimator 204 to collimate different wavelengths of EMR emitted from the laser diode 202 (the EMR is represented by the lines designated as 218) into a collimated beam 220.

Figure 5:
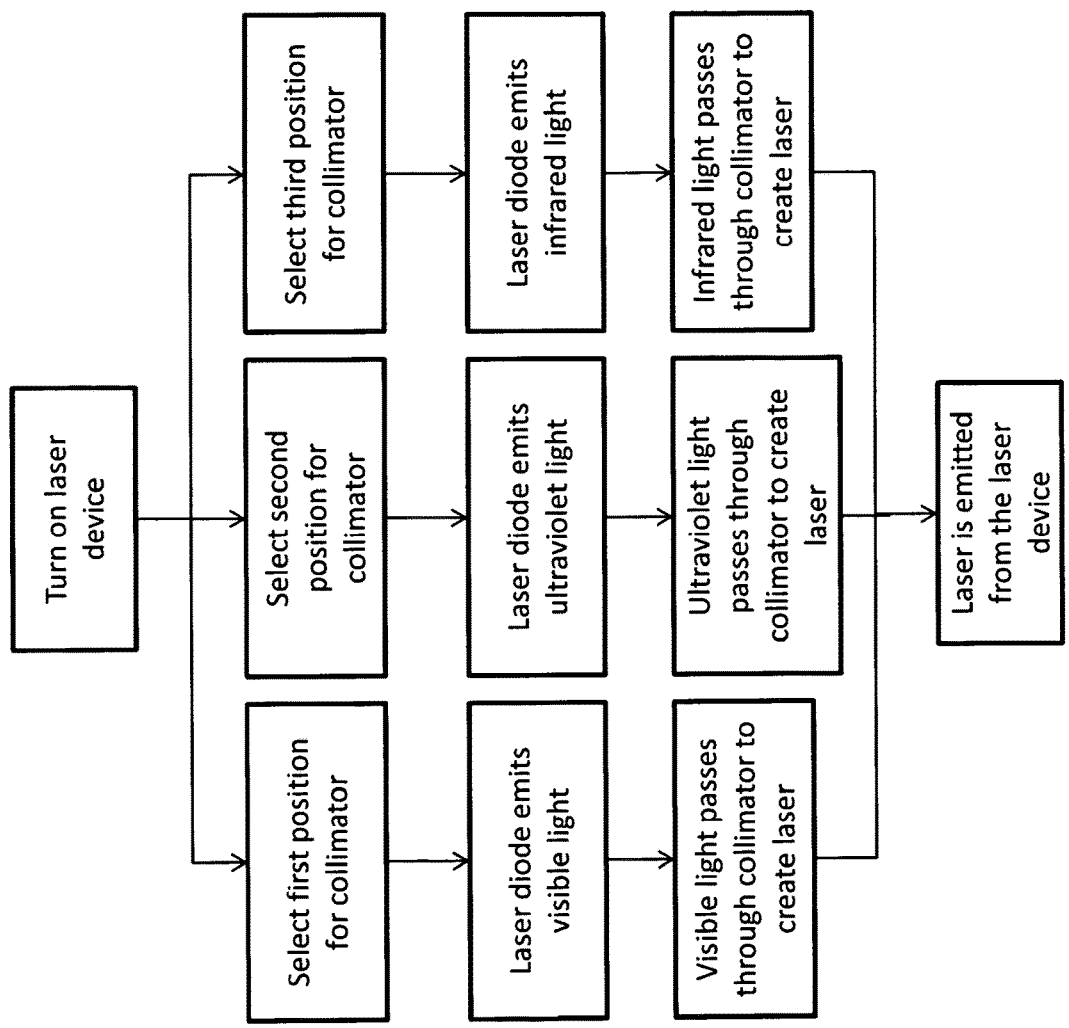
FIG. 5 is a flow diagram showing the function of the embodiment of the laser device in FIG. 2 having a diode capable of emitting three different wavelengths of light.

While the non-achromatic collimator 204 can be moved manually, it is preferably moved by an electronic means. For example, the non-achromatic collimator 204 can be moved manually via a component that extrudes from the housing 206, or it can be moved automatically by an electronic motor or other means of generating lateral movement. A control system can likewise be implemented that enables the non-achromatic collimator 204 to move to and from the laser diode 202 by means of a button press or other electronic trigger. In coordination with movement of the non-achromatic collimator 204, the laser diode 202 can be electronically controlled to change the wavelength of EMR that it emits based on the position of the non-achromatic collimator 204. The trigger can be located on a surface of the laser device so that a user of the laser device can rotate the compound collimator using the trigger. So when the non-achromatic collimator 204 is in the first position 212, the laser diode can be electronically controlled to emit a first wavelength of EMR, and so on for the second position 214 and third position 216. In this way, the non-achromatic collimator 204 can create a laser beam 220 from the EMR emitted from the laser diode 202 that can emit multiple wavelengths of EMR from a single source location. An example of a method that links the position of the achromatic collimator 204 to the EMR emitted from the laser diode 202 can be seen in FIG. 5, which shows an exemplary method of using certain embodiments of the laser device.

Some of the features described in FIG. 2 are additionally described in relation to FIG. 1 both above and below. For purposes of this application, FIGS. 1 and 2 can be considered to include features of the same embodiment, or to include features of different embodiments. In addition, any of the embodiments of described in this application can include additional features that are useful in weapons applications, such as mechanisms to enable windage adjustments or any mechanisms used to calibrate a laser mounted to a firearm. While not always pictured, such common mechanisms are explicitly contemplated by the inventors.

Figure 3:
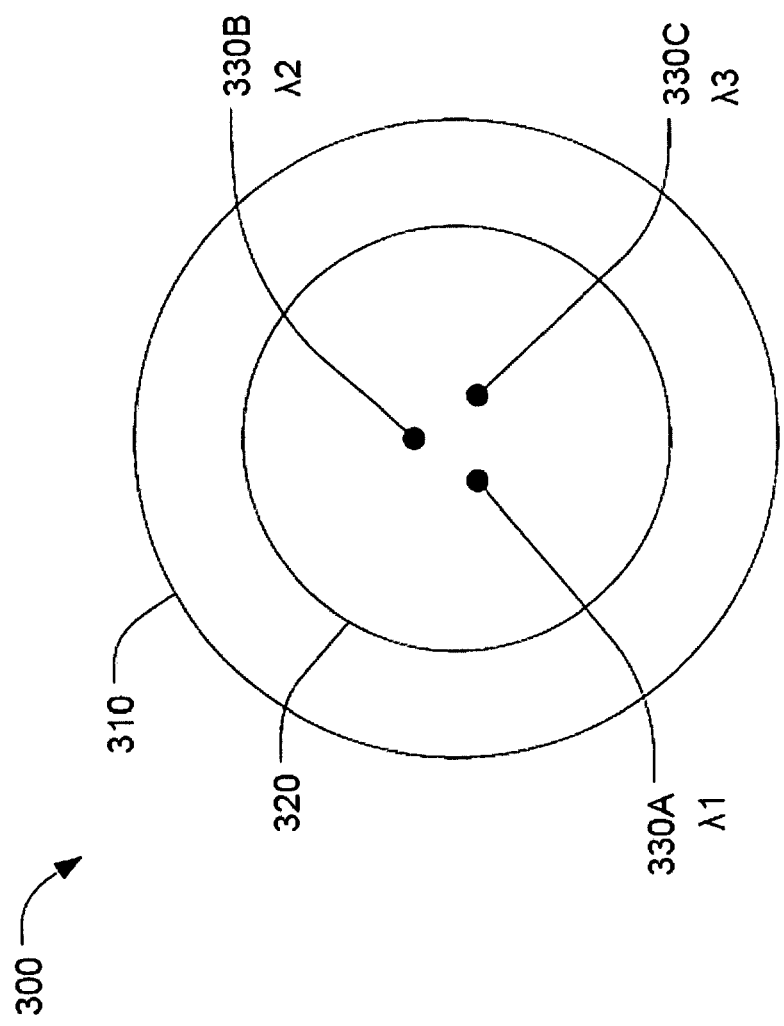
FIG. 3 shows a representation of an exemplary laser diode.

FIG. 3 is an end view of an exemplary laser diode 300. A package 310 includes a window 320 that is transparent to the different wavelengths (e.g. ultraviolet/violet, red/green, and infrared wavelengths) of two, three, or more solid-state light emitters mounted within the package. The window 320 may be made from, for example, quartz, fused silica, sapphire, and certain types of optical glass. The emitting areas 330A, 330B, 330C of the three solid-state light emitters may be arranged, for example, in a triangular pattern (as shown), a linear array, or some other pattern without departing from the scope of the invention. The emitting areas 330A, 330B, 330C of the three solid-state light emitters may be coplanar, which is to say disposed in a common plane. U.S. Pat. No. 6,956,322 provides internal structural details of a contemplated three-wavelength light emitter, which is incorporated herein by reference.

Referring back to FIG. 1, the collimator 120 may convert optical energy 116 emitted by the laser diode 110 into a beam 125 output from the laser device 100. The term "collimator" is intended to include any optical system capable of collimating light emitted from a point source and is not limited to combinations of transparent refractive optical elements. The collimator 120 may use refractive, diffractive, and/or reflective optical elements and combinations thereof. The collimator 120 may be implemented by a single refractive optical element such as a molded spherical or aspheric lens, in which case the collimator 120 may have a different focal length for each of the three wavelengths emitted by the laser diode 110. The collimator 120 may be achromatized, which is to say the collimator may be designed to have the same, or nearly the same, focal length for each of the three wavelengths emitted by the laser diode 110.

The power supply 130 provides regulated power to the laser diode 110. The voltage and/or current of the regulated power provided to the laser diode 110 may be different for each of the three light emitters within the laser diode 110. The voltage and/or current of the regulated power provided to the laser diode 110 may be adjusted in consideration of operational conditions, such as ambient light level and/or the reflectivity of a target. The power supply 130 may receive power from a power source such as a battery, which is not shown.

Optionally, a portion 118 of the optical energy 116 emitted by the laser diode 110 may be detected by a sensor 140. The sensor 140 may provide a feedback signal 142 to the power supply 130. A module (not shown) in the power supply my vary the amount of power provided by the power supply as a function of the feedback signal 142 such that the source emits a desired amount of optical energy 116 when variations in temperature and other factors may require more, or less, power output.

The sensor 140 may include one, two, or three photodiodes or other solid state detectors to measure the optical power in the portion 118 of the optical energy emitted by the source 110. The portion 118 may be a known fraction (not necessarily the same fraction for each of the three light emitters) of the optical energy 116 emitted by the laser diode 110, such that measuring the portion 118 indirectly measures the absolute power of the optical energy 116. The portion 118 may be an unknown fraction of the optical energy 116 emitted by the laser diode 110. In this case the feedback 142 from the sensor 140 may be used to regulate the output from the laser diode 110 without knowing the absolute power of the optical energy 116. Although shown as a separate functional block in FIG. 1, the sensor 140 may be physically integrated into the package 112 containing the laser diode 110.

The positioning mechanism 150 may adjust a position of the collimator 120 and/or the laser diode 110 such that a direction of the beam 125 output from the laser device 100 is parallel to a reference direction 165 for all three wavelengths emitted by the laser diode 110. The function of the positioning mechanism will be discussed in further detail subsequently. The positioning mechanism 150 may adjust the position of the collimator 120 and/or the laser diode 110 using one or more electromechanical actuator, such as a motor coupled to a fine pitch screw or a solenoid. The positioning mechanism 150 may adjust the position of the collimator 120 and/or the laser diode 110 using one or more pneumatic, hydraulic, or shape memory actuators. The positioning mechanism 150 may adjust the position of the collimator 120 and/or the laser diode 110 using a mechanical apparatus, such as a cam or linkage actuated by a user of the triple-wavelength pointing device. For example, as will be discussed subsequently, the wavelength selector 160 may comprise a rotary switch operated by the user. In this case, the rotation of the switch could adjust the position of the collimator 120 and/or the laser diode 110 via a rotary cam or other mechanical linkage. The positioning mechanism 150 may adjust the position of the collimator 120 and/or the laser diode 110 in some other manner.

The wavelength selector 160 determines which one of the three light emitters is active based on one or more operator actions such as actuating a rotary switch or activating one or more buttons or keys on a control panel (not shown). The control panel may be a portion of the laser device 100 or may be coupled to the laser device via a wired or wireless communications link (not shown). The wavelength selector 160 controls the operation of the other functional blocks of the of the laser device 100.

After the operator has selected one of the three light emitters in the source 110 for operation, the power supply 130 is controlled to provide the appropriate power for the selected light emitter. The voltage and/or current provided from the power supply 130 to the source 110 may be different for each of three light emitters. In the case where two or more detectors are provided in the sensor 140, the appropriate detector is selected to provide the feedback signal. As will be discussed further with respect to FIG. 3 through FIG. 6, the positioning mechanism 160 is controlled to adjust the relative positions of the collimator 120 and the selected light emitter.

The laser device 100 may include a pointing mechanism 170 to adjust the reference direction 165 with respect to an external reference. For example, the laser device 100 may be mounted to a projectile weapon such as rifle. In this case the pointing mechanism 170 may rotate the reference direction 165 with respect to the axis of the weapon's barrel. The pointing mechanism 170 may include an elevation adjustment and a windage adjustment. The elevation adjustment may be used to depress the reference direction 165 and the direction of the collimated beam 125 with respect to the axis of the barrel as a function of range to a target to compensate for the effect of gravity on the projectile fired from the weapon. The windage adjustment may be used to adjust the reference direction 165 and the direction of the collimated beam 125 laterally with respect to the axis of the barrel to compensate for the effect of cross-wind on the projectile fired from the weapon.

The laser device 100 may include a viewing subsystem 180 to assist the operator in viewing where the collimated beam 125 intersects a target. The viewing subsystem 180 may include a telescope for viewing the target using ambient illumination. The viewing subsystem 180 may include a night vision device for viewing the target at night. The axis of each of the telescope and the night vision device may be aligned parallel to the reference direction 165. Each of the telescope and the night vision device may present or display a reticle that shows where the axis of the viewing device, and thus the reference direction, intersects a target.

Ideally, the collimated beam 125 is parallel to the reference direction 165 and the axis of the viewing subsystem 180, independent of which of the three light sources is selected. In this case, the collimated beam will intersect the target at the position indicated by the reticle provided by the viewing subsystem 180.

As shown in FIG. 3, the emitting points 330, 332, 334 of the three light emitters in a laser diode 300 may not be collocated. Thus only one of the three emitting points can be disposed along the axis of a collimator. Light emitted from a point along the axis of a collimator will be collimated to form a beam parallel to the axis. Light emitted from points not along the axis will be collimated into beams that are not parallel to the axis. Thus the light emitted by the three emitters 330, 332, and 334 will be collimated into three beams that are not mutually parallel, which is to say three beams heading in different directions. In some embodiments, the laser diode is so small and the different emitting contained within the laser diode are so close together that small differences in the position of each emitter does not affect collimation to such a degree that correction is necessary. In some applications, however, compensation for these differences can be preferable.

Figure 4:
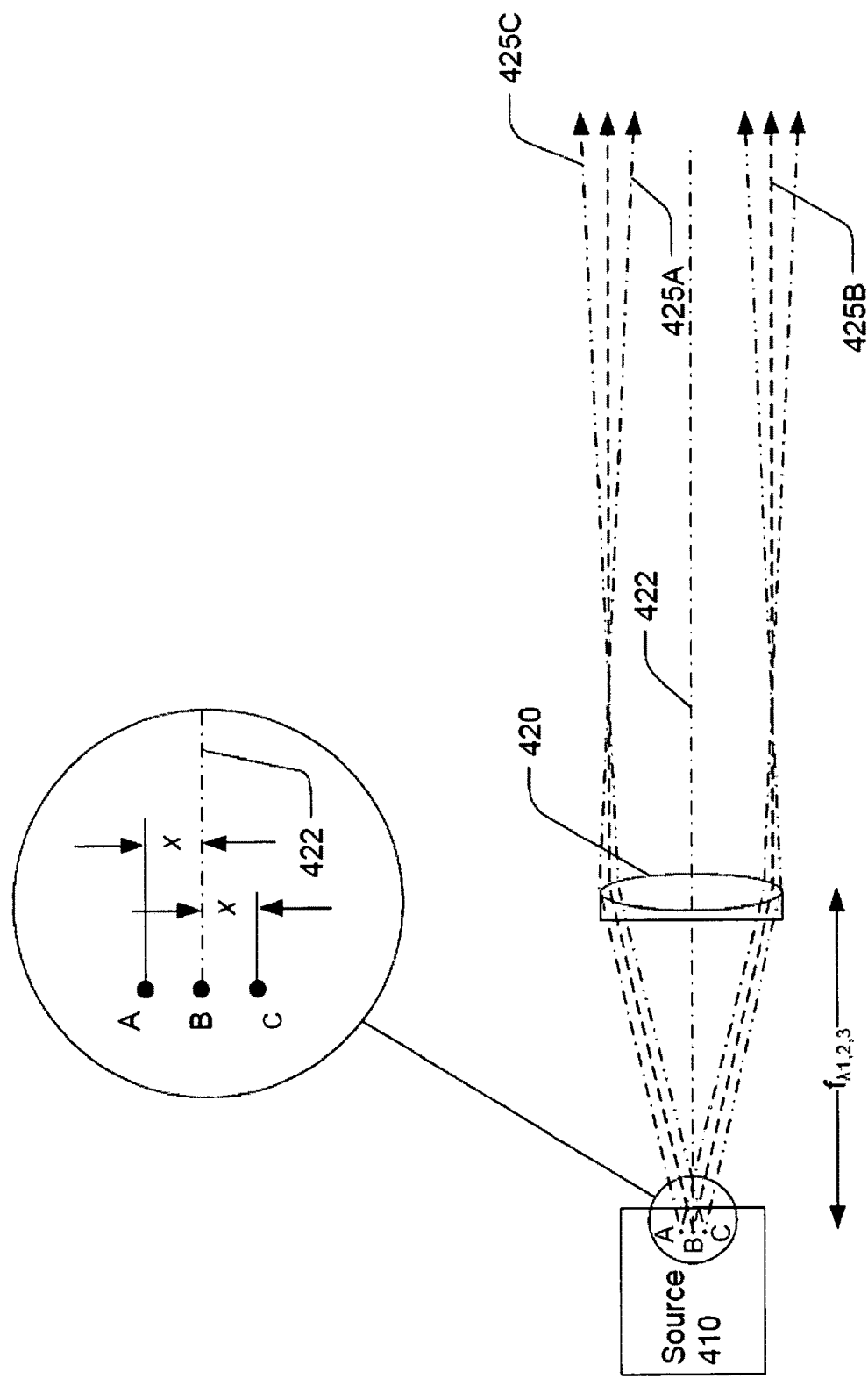
FIG. 4 shows a top view of the laser device.

For example, as illustrated in FIG. 4, assume that a triple-wavelength source 410 contains three sources A, B, C disposed in a plane orthogonal to an optical axis 422 of an achromatic collimator 420. Source B is disposed along the optical axis 422 and source A and C are displaced from the optical axis 422 by a distance x. In this example, a collimated beam 425B formed when light source B is emitting will be parallel to the optical axis 422. Collimated beams 425A and 425C formed when light source A and C, respectively, are emitting will not be parallel to the optical axis. Collimated beams 425A and 425C will deviate from the optical axis by angles of approximately ±x/f, where f is the focal length of the achromatic collimator 420. In this example, only the collimated beam 425B, formed when light source B is emitting, will intersect the target at the position indicated by the reticule provided by the viewing subsystem 180. Note that the achromatic collimator 420 in FIG. 3 is achromatic, which is to say the focal length f of the achromatic collimator 420 is essentially the same for each of the three wavelengths λ1, λ2, and λ3 emitted by the triple-wavelength source 410. If the achromatic collimator 420 was not achromatic, only one of the three beams 425A, 425B, and 425C would be collimated. The other two beams would be either converging or diverging.

A pointing device such as the pointing device 100 may be used as a target designator to identify a target to a guided projectile that can detect and home-in on light reflected from the target. A pointing device such as the pointing device 100 may be mounted to rifle or other weapon and used as a sight to help the operator aim the weapon. In either application, the angular difference between the three emitted must be either eliminated or compensated.

Figure 6:
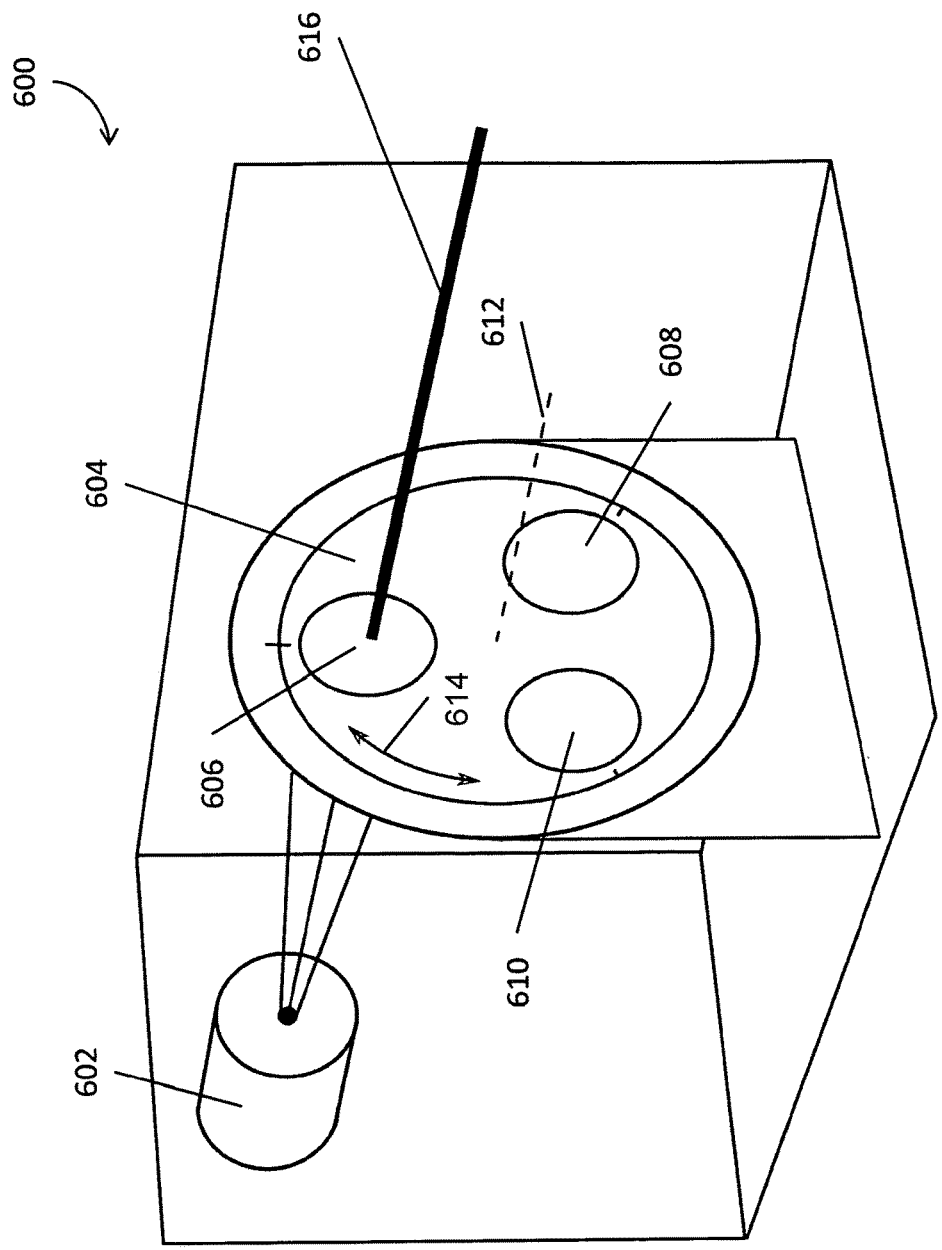
FIG. 6 shows another possible configuration for the laser diode and collimator of an embodiment of a laser device.

FIG. 6 shows an embodiment of a laser device 600 having a laser diode 602 that emits EMR into a compound collimator 604. The compound collimator 604 in this embodiment includes three different non-achromatic collimators 606, 608, & 610 disposed around a central axis of rotation 612. The collimators 606, 608, & 610 are designed to collimate three different wavelengths of EMR emitted from the laser diode 602. Although FIG. 6 shows a compound collimator 604 having three different collimators 606, 608, & 610, the inventors contemplate that other laser devices can require only two collimators on the compound collimator, or in other cases, more than three can be required. When the laser diode generates an emission of, for example, visible light, one region of the collimator can collimate a first wavelength into a first laser, and another region of the collimator can collimate a second wavelength into a second laser, and so on for each of the other collimators on the compound collimator. By having equal focal lengths, the compound collimator can be a fixed distance from the laser diode.

Regardless of the number of collimators required to be disposed on the compound collimator 604, the laser diode 602, as mentioned above with respect to FIG. 3, can include three different emitters that are separated by some amount of distance. To ensure the most accurate laser beam 616 possible (e.g., a laser that points in a direction that is in line with the emitter and collimator without any angular distortion as described with respect to FIG. 4), the non-achromatic collimators 606, 608, & 610 can be positioned on the compound collimator 604 such that as the compound collimator 604 is rotated, the different non-achromatic collimators 606, 608, & 610 are positioned directly in front of the respective emitter within the laser diode 602. Such a configuration could ensure that each different collimator can be properly positioned in front of the laser diode. Variations in position between the different collimators when they are in front of the laser diode can be as small as a few microns, depending on the separation distances between each of the individual emitters within the laser diode 602. Such positioning adjustments can similarly be implemented on embodiments with non-achromatic collimators to further improve accuracy of the resulting laser beam.

As shown by arrows 614 the compound collimator 604 is designed to be rotated about the axis of rotation 612 to bring each different collimator 606, 608, & 610 into action. A rotating mechanism can additionally be included to enable a user to rotate the compound collimator 604 manually (e.g., a component that extrudes from the housing to enable manual manipulation by a laser device's user). In other embodiments, though, the rotating mechanism can be electronically controlled. For example, a closed loop control system can cause a stepper motor to rotate to bring each different non-achromatic collimator 606, 608, & 610 into line with the laser diode 602. An electronically controlled system can be manipulated by button press or by software that communicates with the laser device 600 (e.g., via a wired or wireless connection).

In some embodiments, the collimators on the compound collimator 604 can be achromatic, meaning the collimators can focus a broad spectrum of EMR wavelengths at a single focal length unlike non-achromatic collimators. In these embodiments, the rotating compound collimator 604 can include three identical collimators located around the axis of rotation 612 at slightly different positions to take into account slight differences in the position of each different EMR emitter within the laser diode 602. This approach can increase the accuracy of the laser beam 616 emitted by the laser device.

The compound collimator can also include a locking or holding mechanism to enable it to "click" into different angular positions. Preferably the act of a user switching the compound collimator from one position to another triggers a command signal to be sent to the laser diode to emit the corresponding wavelength of light. Switching the wavelength of EMR the laser diode emits can be accomplished automatically based on the angular position of the compound collimator. This can be accomplished using detents, a ratcheting mechanism, or by any other suitable locking or holding mechanism. The end result, regardless of the mechanism implemented, is that the different collimators 606, 608, & 610 should be properly positioned in front of the laser diode 602 when the compound collimator locks into an angular position.

Figure 7:
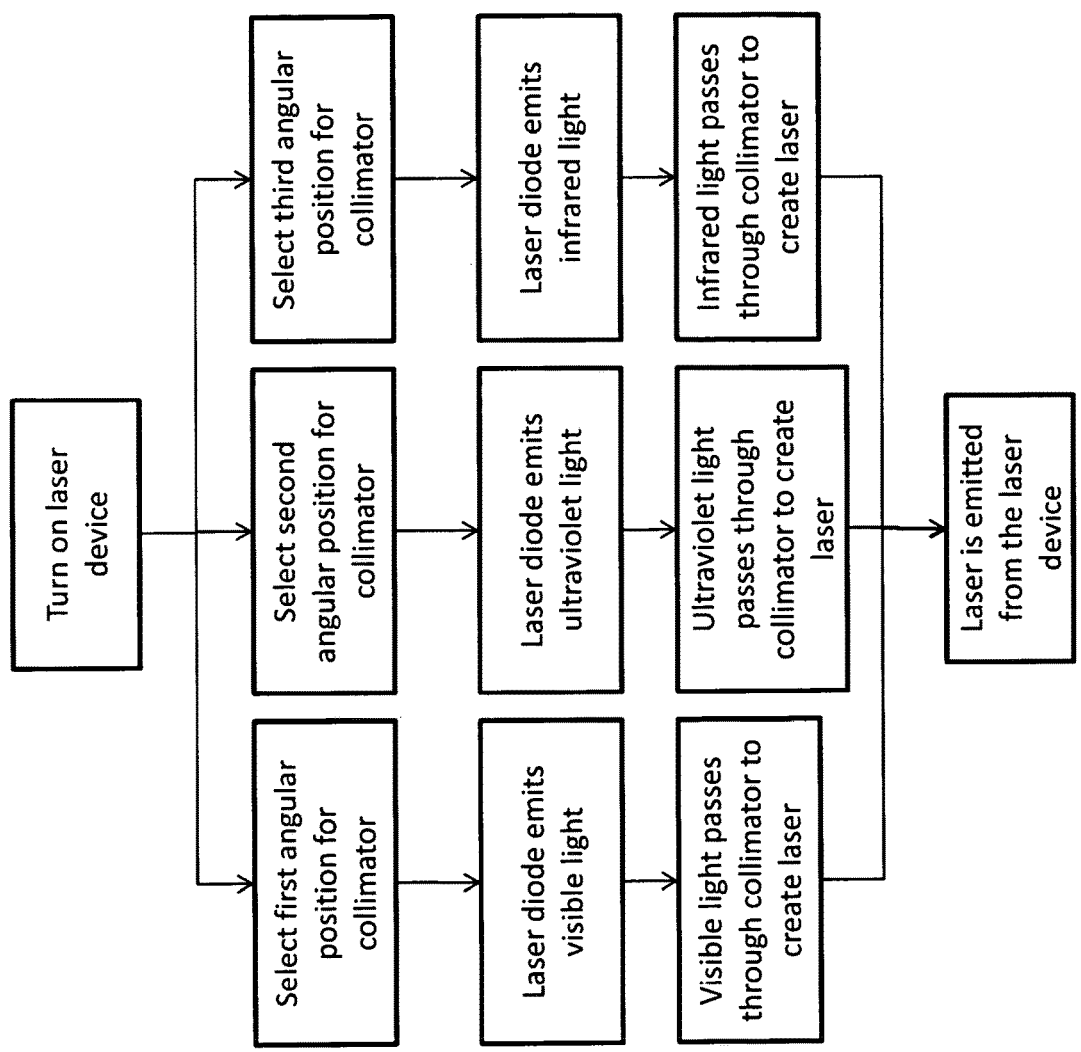
FIG. 7 is a flow diagram showing the function of an embodiment of the laser device in FIG. 6 having a diode capable of emitting three different wavelengths of light.

FIG. 7 shows an exemplary method of using certain embodiments of the laser device that implement a rotating compound collimator can function to select which wavelength of EMR is emitted from the laser diode. By rotating the compound collimator into different angular positions, the laser diode can be caused to emit only the correct corresponding wavelength EMR. A "correct" corresponding wavelength EMR can depend on the position of the emitter within the laser diode (e.g., to compensate for slightly different emitter positions), and it can also depend the wavelength of the EMR emitted from the laser diode (e.g., when non-achromatic collimators are used).

FIGS. 8A, 8B, and 8C show how the differences in emitter positions can be compensated for by adjusting collimator positions. Essentially, the resulting angular difference between the three beams emitted by emitter that are not perfectly coincidental may be eliminated by moving an achromatic collimator 820 or a laser diode 810 laterally such that an optical axis of the collimator 820 passes through the active emitter within the laser diode 810. As shown in FIG. 8A, when source A is emitting, the relative position of the laser diode 810 and collimator 820 are adjusted such that the optical axis passes through source A such that collimated beam 825A is directed parallel to the optical axis. As shown in FIG. 8B, when source B is emitting, the relative position of the laser diode 810 and collimator 820 are adjusted such that the optical axis passes through source B such that collimated beam 825B is directed parallel to the optical axis. As shown in FIG. 8C, when source C is emitting, the relative position of the laser diode 810 and collimator 820 are adjusted such that the optical axis passes through source C such that collimated beam 825C is directed parallel to the optical axis. Although FIGS. 8A, 8B, and 8C show an achromatic collimator, the same effect can be achieved with non-achromatic collimators by using, for example, a rotating compound collimator that brings each different non-achromatic collimator into the correct position relative to the laser diode 810 as described above.

The relative positions of the triple wavelength laser diode 810 and the collimator 820 may be adjusted by the operator actuating a lever or control that moves either the triple wavelength laser diode 810 or the collimator 820 to the appropriate one of three predetermined positions via a cam or other mechanical linkage. The triple wavelength laser diode 810 or the collimator 820 may be moved between the three predetermined positions automatically, which is to say in response to the operator setting an electrical switch (which may also control the power supply and other functional elements of the pointing device). The triple wavelength laser diode 810 or the collimator 820 may then be moved by an actuator such as a solenoid or motor controlled by the electrical switch. The triple wavelength laser diode 810 or the collimator 820 may be moved in some other manner.

Any of the principles described with respect to FIGS. 8A, 8B, and 8C can be implemented in any of the embodiments of the laser device without departing from the inventive concepts described in this application.

Figure 9A:
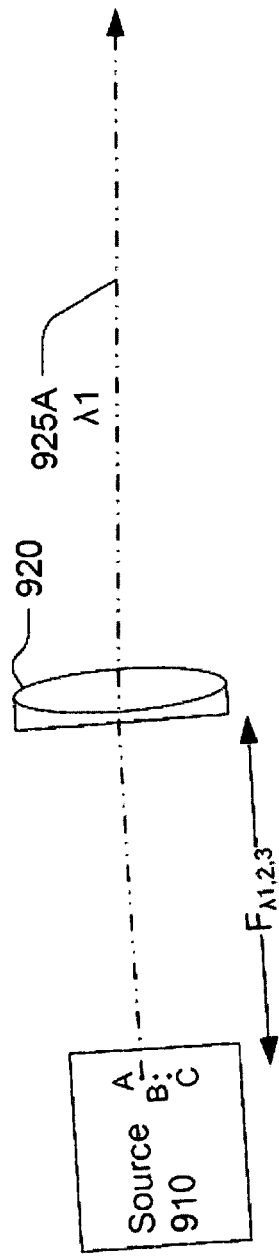
FIGS. 9A, 9B, and 9C are optical schematic diagrams of another laser device configured to compensate for slight differences of emission angles of first, second, and third wavelengths, respectively.
Figure 9B:
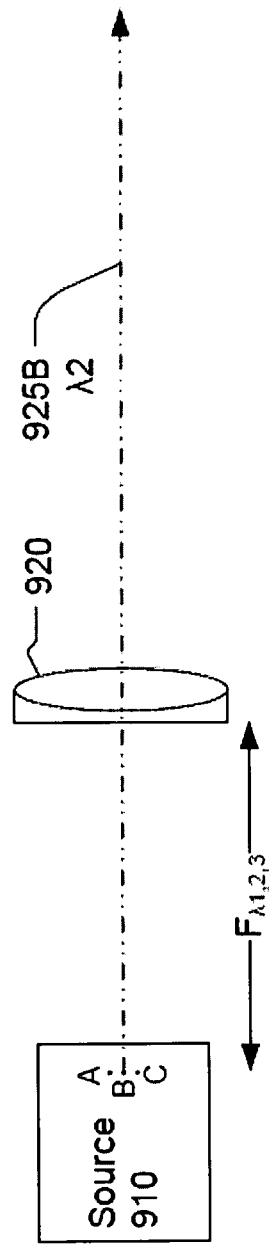
Figure 9C:
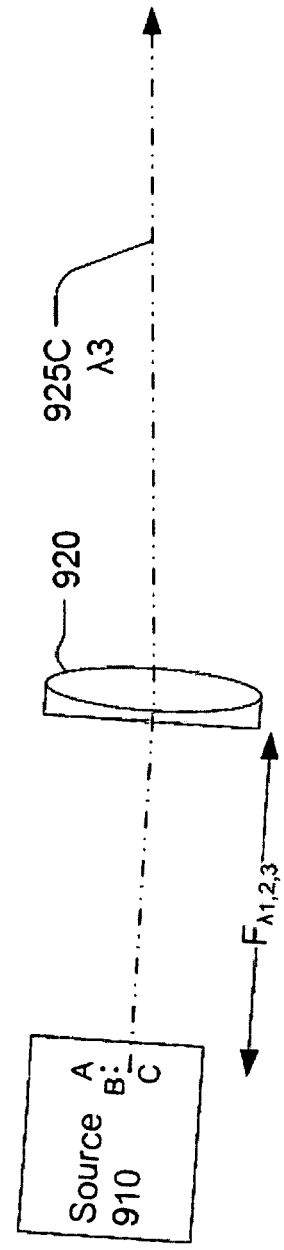

FIGS. 9A, 9B, and 9C, illustrate another technique to compensate for the angular difference between the three emitted beams that would result from implementing a fixed position collimator 920 with a fixed position laser diode 910. The three collimated beams from the three light emitters are not mutually parallel or necessarily parallel to the axis of the collimator. The angular differences between the three collimated beams are compensated by rotating the collimator 920 and the triple-wavelength source 910 as an assembly such that the collimated beam is aimed in the same direction when any one of the three light emitters is active. The rotation of the collimator 920 and the laser diode 910 as an assembly may be accomplished by the positioning mechanism 150, which may also be used for distance and windage compensation. Basically, compensation for the angular difference between the three emitted beams can be accomplished by redefining the "zero elevation" and "zero windage" settings of the pointing mechanism.

Any of the principles described with respect to FIGS. 9A, 9B, and 9C can be implemented in any of the embodiments of the laser device without departing from the inventive concepts described in this application.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of manufacturing a mirrorless laser device for firearms, comprising the steps of:
    providing a housing for the laser device;
    affixing a laser diode within the housing, wherein the laser diode comprises two solid-state light emitters that emit light from a single source location, wherein the first solid-state light emitter is configured to generate a first emission of a first electromagnetic radiation (EMR) at a first wavelength, and a second solid-state light emitter is configured to generate a second emission of a second EMR at a second wavelength;
    affixing a rotating compound collimator within the housing at a fixed distance from the laser diode, wherein the rotating compound collimator comprises a first collimator configured to collimate the first EMR when the rotating compound collimator is at a first angular position and a second collimator configured to collimate the second EMR when the rotating compound collimator is at a second angular position; and
    wherein the first collimator is physically separate from the second collimator on the rotating compound collimator such that only one collimator on the rotating compound collimator collimates light from the laser diode at a time.

2. The method of claim 1, further comprising the step of affixing a locking mechanism to the rotating compound collimator to lock the rotating compound collimator in at least the first angular position and the second angular position.

3. The method of claim 1, further comprising the step of implementing a closed-loop control system to rotate the rotating compound collimator to at least the first angular position and the second angular position.

4. The method of claim 1, further comprising the steps of:
    sensing a power level output of the laser diode by an active light emitter; and
    providing the power level output as feedback to a power supply.

* * * * *